(12) United States Patent
Suzuki (10) Patent No.: US 6,903,564 B1
(45) Date of Patent: Jun. 7, 2005

(54) DEVICE AGING DETERMINATION CIRCUIT

(75) Inventor: Shingo Suzuki, San Jose, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 10/712,847

(22) Filed: Nov. 12, 2003

(51) Int. Cl.[7] ............................................. G01R 31/00
(52) U.S. Cl. ....................................................... 324/763
(58) Field of Search ........................... 257/48; 324/537, 324/763, 764–769, 71.1, 71.5

(56) References Cited

U.S. PATENT DOCUMENTS

| | | | |
|---|---|---|---|
| 6,242,937 B1 * | 6/2001 | Lee et al. ................... | 324/769 |
| 6,476,632 B1 * | 11/2002 | La Rosa et al. ............ | 324/769 |
| 6,535,014 B2 * | 3/2003 | Chetlur et al. ............. | 324/765 |
| 6,731,179 B2 * | 5/2004 | Abadeer et al. ............. | 331/57 |
| 6,762,966 B1 * | 7/2004 | LaRosa et al. ............. | 365/201 |
| 6,798,230 B1 * | 9/2004 | Taylor et al. .............. | 324/763 |
| 2004/0148111 A1 * | 7/2004 | Gauthier et al. ........... | 702/34 |

* cited by examiner

*Primary Examiner*—Evan Pert
(74) *Attorney, Agent, or Firm*—Wagner, Murabito & Hao LLP (57) ABSTRACT

A device aging determination circuit. Circuits are located on a device, including a first circuit operating at a first duty cycle and generating a first output and a second circuit operating at a second duty cycle different from said first duty cycle and generating a second output. A measuring circuit determines a difference in the first output and the second output, wherein the difference indicates an aging of the device. The aging is a representation of how much degradation the device has been exposed to, and allows for dynamic adjustment of operating parameters of the device to optimize performance.

48 Claims, 8 Drawing Sheets

DEVICE AGING DETERMINATION CIRCUIT

FIELD OF INVENTION

The present invention generally relates to the field of electronic circuits. Specifically, embodiments of the present invention relate to a circuit for determining the aging of a device.

BACKGROUND OF THE INVENTION

In order to increase the performance of an integrated circuit (IC), the voltage is often raised. However, if the voltage is raised, the higher stress causes the IC to age faster due to, for instance, hot carrier injection (HCI). Degradation of ICs, such as Complementary Metal Oxide Semiconductor (CMOS) chips, due to HCI is a common problem for most ICs. In general, HCI degradation is related to the frequency and the activity of an IC as well as the voltage. Every time a switch of the IC toggles HCI degradation occurs, as a result of the most HCI sensitive condition typically occurring when the device switches. Generally, the faster the rate of switching of the IC, the faster the IC ages.

To optimize performance and power of an IC, it is desirable to set the supply voltage to a point where the IC just satisfies the required performance. However, as the IC ages, the required voltage changes over time. Therefore, it is necessary to use conservative conditions in the designing of an IC, to account for the degradation caused by HCI. These conservative design conditions typically result in performance and power usage that is not optimized.

SUMMARY OF THE INVENTION

Accordingly, a need exists for a circuit for determining well-defined degradation rate of a device. Furthermore, a need exists for a circuit that satisfies the above need and allows for estimating the age of the device. A need also exists for a circuit that satisfies the above needs and provides allows for dynamic adjustment of parameters of the device, thereby reducing the effects of hot carrier injection (HCI).

Various embodiments of the present invention, a device aging determination circuit, are described. In one embodiment, two circuits are located on a device, wherein a first circuit operates at a first duty cycle and generates a first output and a second circuit operates at a second duty cycle different from said first duty cycle and generates a second output. In one embodiment, the device is an integrated circuit. In one embodiment, the first output is measured at a node of the first circuit and the second output is measured at a node of the second circuit. A measuring circuit determines a difference in the first output and the second output, wherein the difference indicates an aging of the device. The aging is a representation of the amount of degradation the device has been exposed to, and allows for dynamic adjustment of operating parameters of the device to optimize performance.

In one embodiment, the first circuit and the second circuit are analogous circuits. In one embodiment, the first circuit and the second circuit are ring oscillator circuits. In one embodiment, the first output is a first frequency and the second output is a second frequency. In one embodiment, the ring oscillator circuits are nineteen stage ring oscillator circuits. In one embodiment, the ring oscillator circuits comprise an enable switch.

In one embodiment, the first duty cycle is substantially normally on and the second duty cycle is substantially normally off. In one embodiment, the second circuit is powered down. In another embodiment, the second circuit is powered up but not enabled. In one embodiment, the first circuit is powered up in response to a powergood signal. In another embodiment, the first circuit is powered up in response to a resetb signal.

In one embodiment, the measuring circuit comprises a multiplexer for selecting between the first output and the second output and a counter circuit for receiving the first output and the second output, and for determining the difference. In one embodiment, the measuring circuit further comprises at least one frequency divider circuit for standardizing the first output and the second output. In another embodiment, the measuring circuit comprises a first counter circuit for receiving the first output and a second counter circuit for receiving the second output. In one embodiment, the measuring circuit further comprises a first frequency divider circuit for standardizing the first output and a second frequency divider circuit for standardizing the second output.

In another embodiment, the present invention provides a method for determining an aging of a device. A first output is received from a first circuit operating at a first duty cycle, and a second output is received from a second circuit operating at second duty cycle different from the first duty cycle. A difference in the first output and the second output is determined, wherein the difference indicates an aging of the device.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the various embodiments of the invention, examples of which are illustrated in the accompanying drawings. While the invention will be described in conjunction with the various embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
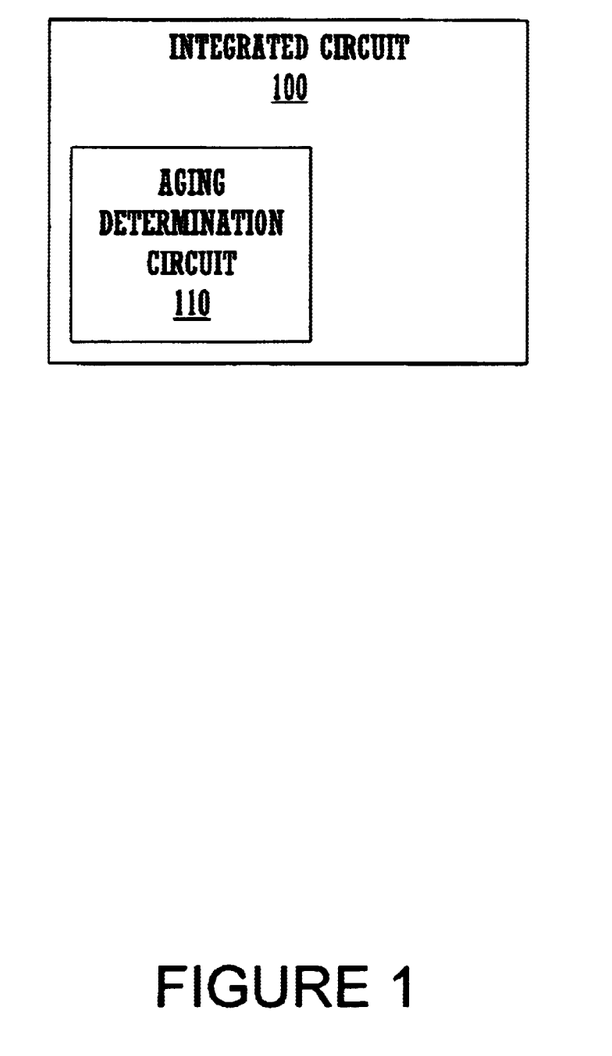
FIG. 1 is a block diagram showing an exemplary integrated circuit upon which embodiments of the invention may be implemented.

FIG. 1 is a block diagram showing an exemplary integrated circuit 100 upon which embodiments of the invention may be implemented. Integrated circuit 100 may be implemented on a single die and packaged as a "chip" or integrated circuit device. In one embodiment, integrated circuit 100 is a CMOS Large Scale Integration (LSI) chip. In one embodiment, integrated circuit 100 includes a number of electronic components for performing particular functions. For example, integrated circuit 100 may include a bus, memory such as random access memory (RAM) or read-only memory (ROM) for storing volatile or temporary data during firmware execution, a central processing unit (CPU) for processing information and instructions, input/output (I/O) pins providing an interface with external devices and the like, and aging determination circuit 110.

Aging determination circuit 110 is operable to perform a process for determining the maximum aging of integrated circuit 100. Integrated circuit 100 degrades over time in part due to hot carrier injection (HCI) degradation. The magnitude of HCI degradation is related to the activity of integrated circuit 100. Aging determination circuit 110 has its own well-defined degradation rate and is operable to dynamically monitor the maximum usage of integrated circuit 100, such that an aging of integrated circuit 100 can be estimated.

Figure 2:
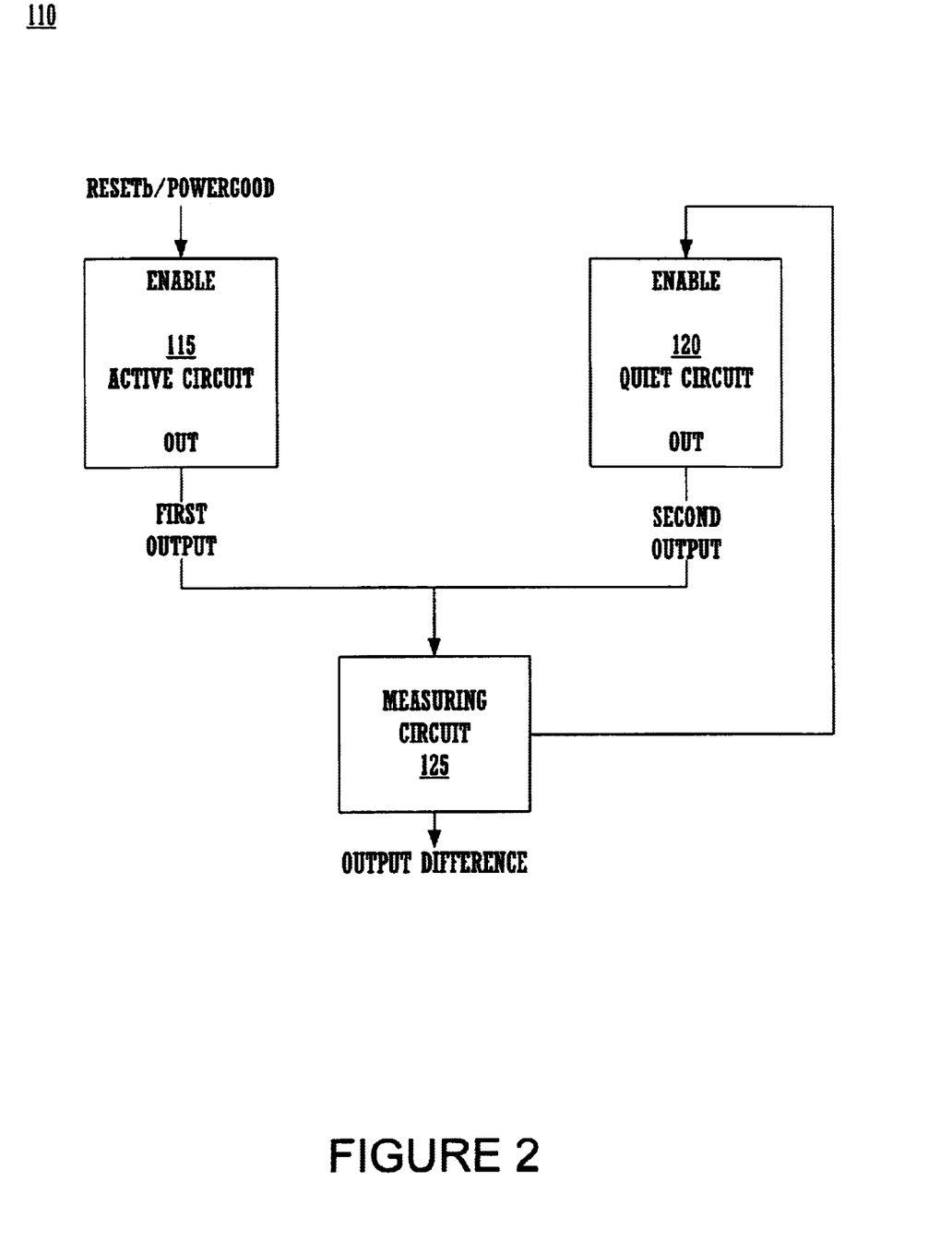
FIG. 2 is a block diagram of an aging determination circuit in accordance with one embodiment of the invention.

FIG. 2 is a block diagram of aging determination circuit 110 in accordance with one embodiment of the invention. In one embodiment, aging determination circuit 110 may be part of an integrated circuit (e.g., integrated circuit 100 of FIG. 1). However, it should be appreciated that aging determination circuit 110 may be utilized in conjunction with any electronic device for determining aging due to usage of the electronic device.

In one embodiment, aging determination circuit 110 comprises active circuit 115, quiet circuit 120, and measuring circuit 125. Active circuit 115 and quiet circuit 120 are analogous circuits with a measurable output that is subject to variation over time. In one embodiment, active circuit 115 and quiet circuit 120 are ring oscillator circuits. In one embodiment, active circuit 115 and quiet circuit 120 are 19 stage ring oscillator circuits. In one embodiment, upon initialization (e.g., at time=0), both active circuit 115 and quiet circuit 120 run in the same manner, as they are analogous. The respective outputs of active circuit 115 and quiet circuit 120 are initially identical, as neither circuit has been exposed to HCI.

In another embodiment, while active circuit 115 and quiet circuit 120 run in the same manner, as they are analogous circuits, upon initialization the outputs are not identical. For example, process variation in manufacturing the circuits could result in an initial offset of the outputs. In one embodiment, the initial offset is stored in non-volatile memory of aging determination circuit 110. In another embodiment, the initial offset is stored in a fuse of aging determination circuit 110. In one embodiment, the initial offset is stored in non-volatile memory of the device (e.g., integrated circuit 100 of FIG. 1). In another embodiment, the initial offset is stored in a fuse of the device.

Figure 3:
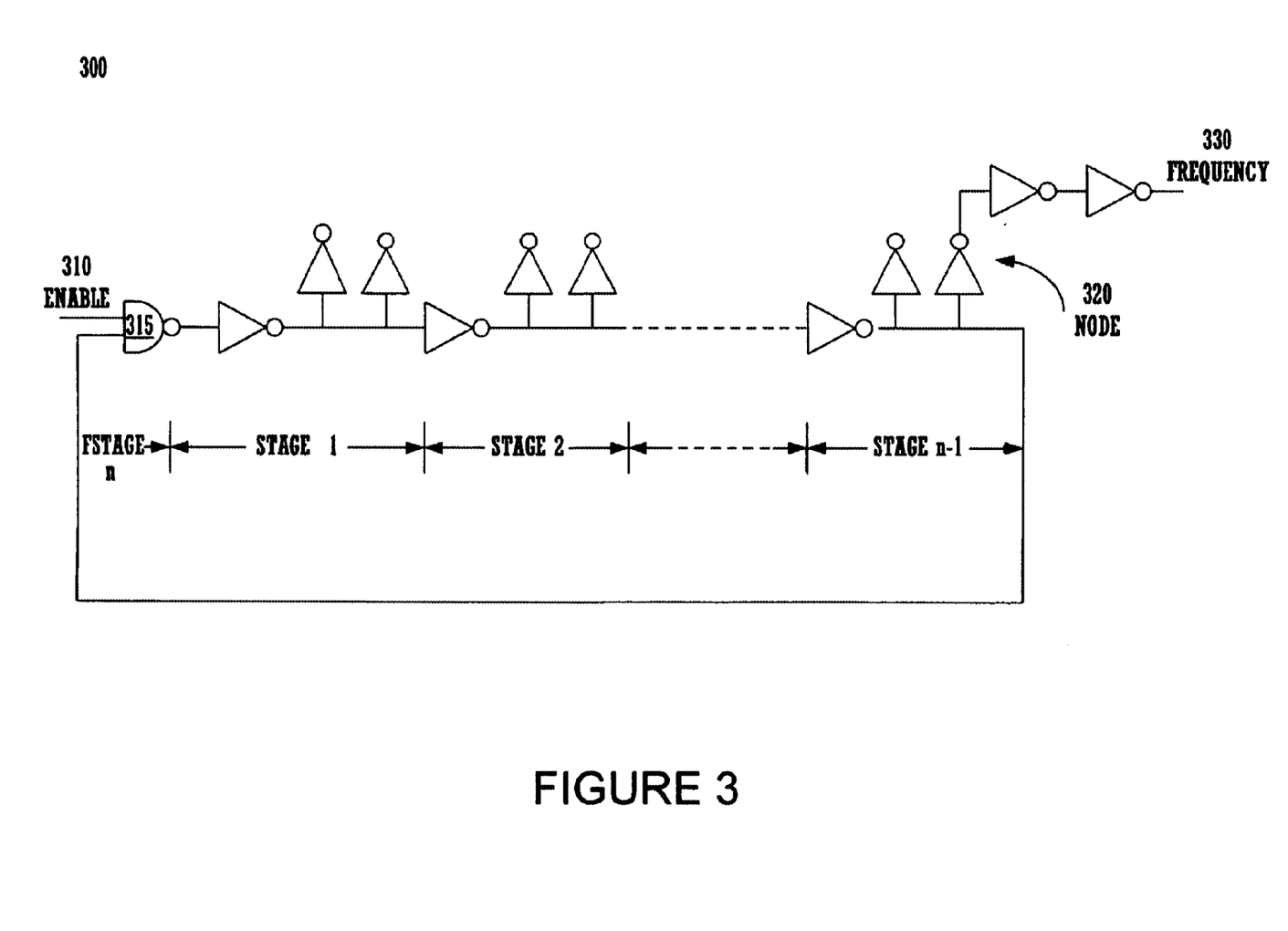
FIG. 3 is a circuit diagram of an exemplary ring oscillator circuit in accordance with one embodiment of the invention.

With reference to FIG. 3, a circuit diagram of an exemplary ring oscillator circuit 300 in accordance with one embodiment of the invention is shown. Ring oscillator 300 comprises n stages, where n is a whole number. It should be appreciated that any type of ring oscillator circuit can be used, such as fanout-3 inverter rings, fanout-12 inverter rings, or larger inverter rings.

As shown, ring oscillator circuit 300 comprises stages 1 through n−1 of inverters. Stage n is a NAND gate 315 that is coupled to stage n−1 and enable switch 310. Ring oscillator circuit 300 operates at a particular frequency that varies over time.

With reference to FIG. 2, in one embodiment active circuit 115 and quiet circuit 120 are ring oscillator circuits. Active circuit 115 operates at a first duty cycle, wherein the first duty cycle is substantially normally on. In one embodiment, active circuit 115 oscillates when a powergood signal is set to high. In another embodiment, active circuit 115 oscillates when a resetb is deasserted.

Figure 4:
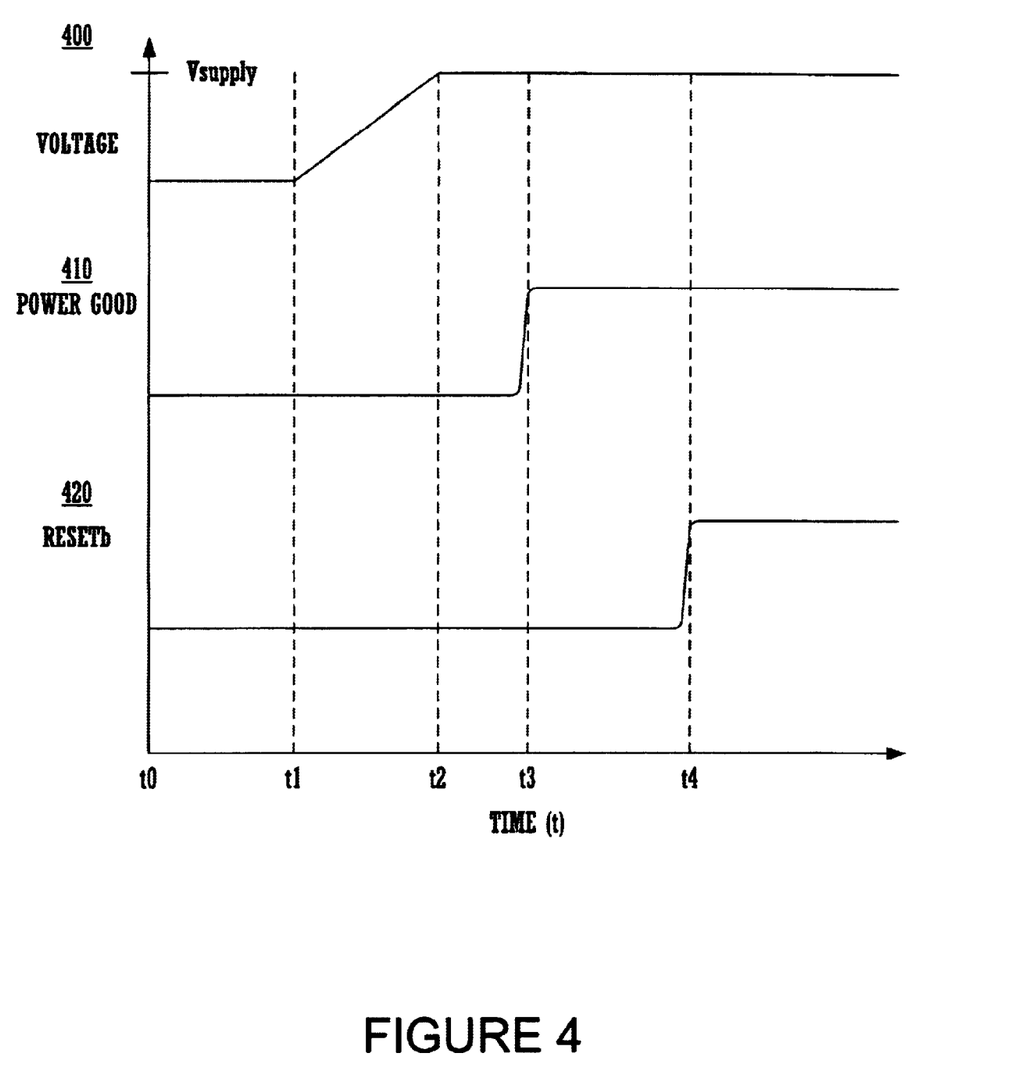
FIG. 4 is a timing diagram illustrating relative signals in accordance with one embodiment of the present invention.

FIG. 4 is a timing diagram illustrating relative signals for controlling the oscillation of a ring oscillator circuit in accordance with one embodiment of the present invention. At time $t_0$, the voltage 400, the powergood signal 410, and the reset signal 420 are all low. At time $t_1$, the ring oscillator circuit is powered on. In general, voltage 400 gradually increases until it reaches voltage 400 reaches the supply voltage ($V_{supply}$) at time $t_2$. After the supply voltage is reached, at time $t_3$, powergood signal 410 is set to high. Similarly, after powergood signal 410 is set to high, resetb signal 420 is deasserted and set to high at time $t_4$.

With reference to FIG. 2, in one embodiment, active circuit 115 oscillates once the supply voltage has been reached, as indicated by a reset signal or a powergood signal. It should be appreciated that in general, the time between power on and oscillation is minimal with respect to the overall time of oscillation. Therefore, active circuit 115 is substantially normally on, and oscillates accordingly. As shown in FIG. 3, enable switch 310 is enabled once the supply voltage is reached, causing ring oscillator circuit 300 to oscillate.

Quiet circuit 120 operates at a second duty cycle, wherein the second duty cycle is substantially normally off. In one embodiment, quiet circuit 120 is powered down. In another embodiment, quiet circuit 120 is powered up but is not enabled (e.g., enable switch 310 of FIG. 3 is not enabled). While active circuit 115 ages as fast as the device in which it is included in (e.g., integrated circuit 100 of FIG. 1), quiet circuit 120 does not age since the HCI exposure is negligibly small to that of active circuit 115.

The difference of the outputs between active circuit 115 and quiet circuit 120 can be used as an indicator as to the amount the device has been exposed to HCI. In other words, it is possible to measure the aging of the device relative to its usage.

In response to a measurement request, measuring circuit 125 is operable to measure the first output of active circuit 115 and the second output of quiet circuit 120, and to determine a difference between the first output and the second output. The difference provides an indication of an age of the device. Quiet circuit 120 is only enabled in response to a measurement request. In one embodiment, a measurement request is received upon booting the device. In another embodiment, a measurement request is received according to a predetermined time period (e.g., monthly or quarterly). It should be appreciated that the frequency of measurement requests can be adjusted according to the predicted use of the device. For example, if the device is normally on, a measurement request would be generated more often than if the device is only used for a few hours a day.

Upon receipt of a measurement request, the first output and the second output are measured. With reference to FIG. 3, the output of ring oscillator circuit 300 is a frequency (e.g., frequency 330). The frequency can be measured at any node of (e.g., an inverter) of ring oscillator circuit 300. As shown, frequency 330 is measured at node 320. However, it should be appreciated that the output frequency can be measured at any node.

Furthermore, with continuing reference to FIG. 2, upon the receipt of a measurement request, quiet circuit 120 is enabled. Enabling quiet circuit 120 allows for the second output to be measured. Since quiet circuit 120 is not exposed to HCI, second output is substantially identical at the time of measurement as at the time of initialization. A measurement of first output is also taken in response to the measurement request.

Figure 5A:
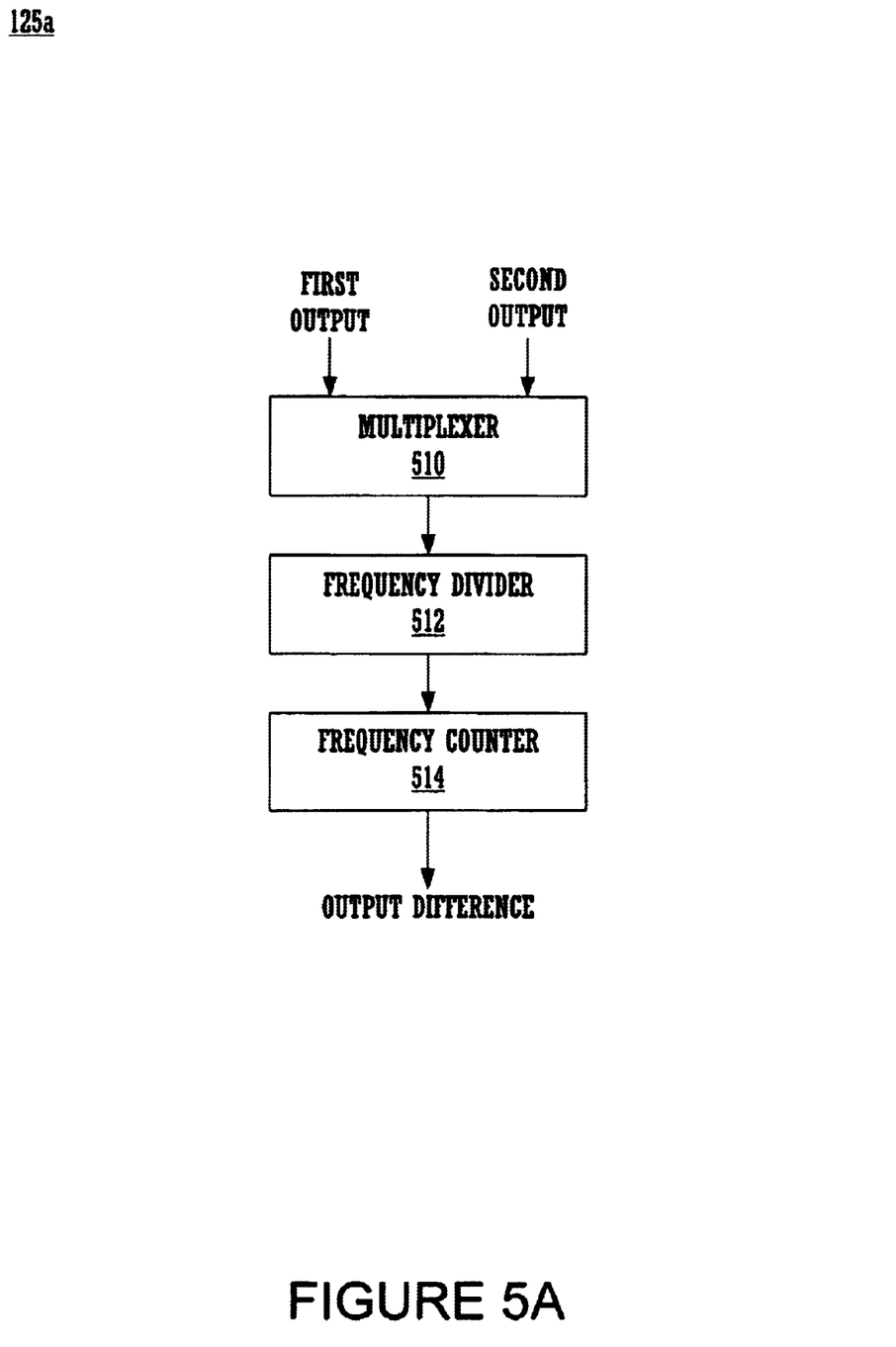
FIGS. 5A, 5B and 5C are circuit diagrams illustrating various embodiments of a measuring circuit in accordance with the invention.
Figure 5B:
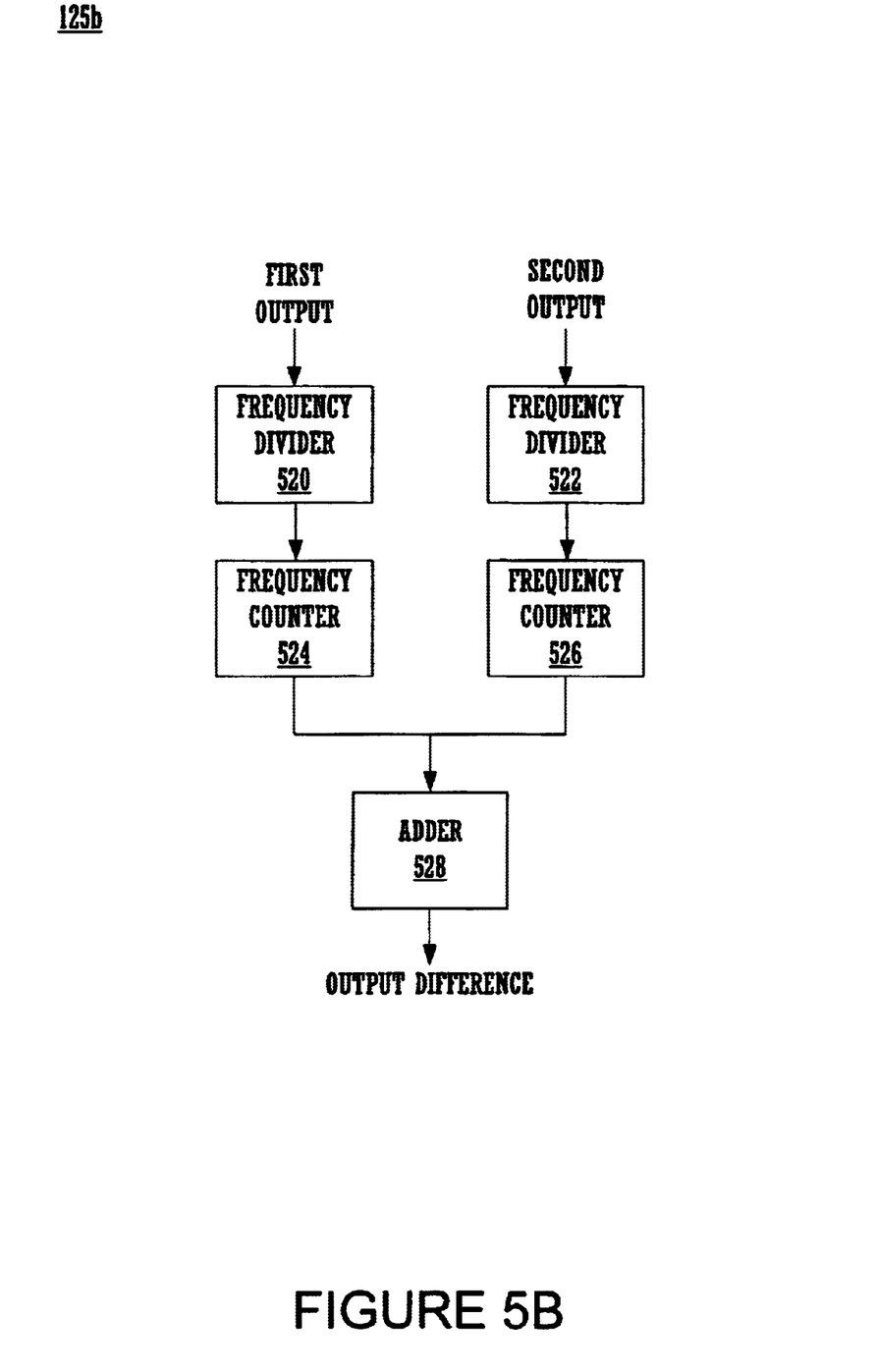
Figure 5C:
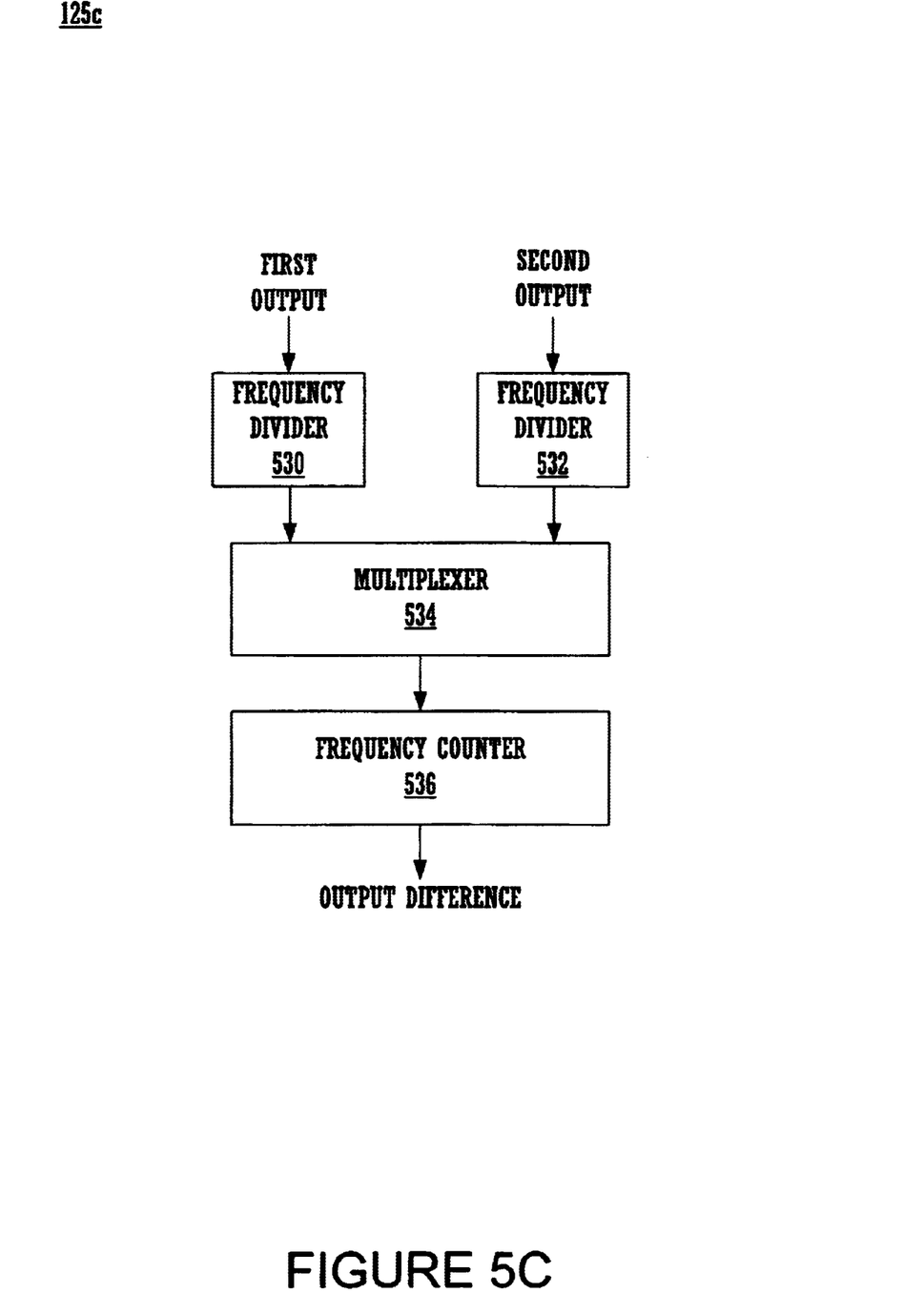

FIGS. 5A, 5B and 5C are circuit diagrams illustrating various embodiments of a measuring circuit in accordance with the invention. With reference to FIG. 5A, measuring circuit 125a is shown. Measuring circuit 125a comprises multiplexer 510, frequency divider 512, and frequency counter 514. Multiplexer 510 is operable to receive both the first output from the active circuit and the second output from the quiet circuit. In response to a measurement request, multiplexer 510 measures the first output and the second output, one at a time.

In one embodiment, the measurement is received at frequency divider 512, which is operable to standardize the measurement so it is in a usable format. For example, if the active circuit and quiet circuit operate at very high frequencies (e.g., a three stage ring oscillator circuit), it may be necessary to divide the output frequency to get a usable format. However, it should be appreciated that frequency divider 512 is optional, and is not necessary in embodiments of the present invention.

Frequency counter 514 then receives the outputs. In one embodiment, software of frequency counter 514 is operable to determine a difference between the first output and the second output, to generate an output difference. In one embodiment, frequency counter 514 compensates for a stored initial offset in determining the output difference. In another embodiment, frequency counter 514 is operable to store both outputs, and external calculations (e.g., a processor of integrated circuit 100 of FIG. 1) are used to determine the output difference. In one embodiment, the external calculations compensate for a stored initial offset in determining the output difference.

With reference to FIG. 5B, measuring circuit 125b is shown. Measuring circuit 125b comprises frequency dividers 520 and 522, frequency counters 524 and 526, and adder 528. Frequency divider 520 is operable to receive the first output from the active circuit and frequency divider 522 is operable to receive the second output from the quiet circuit. Because there are two frequency dividers, measurements for the first output and the second output can be taken simultaneously. It should be appreciated that frequency dividers 520 and 522 are optional, and are not necessary in embodiments of the present invention (e.g., the measurements of the first output and the second output are in a usable format).

Frequency counter 524 receives the first output and frequency counter 526 receives the second output. In one embodiment, software of optional adder 528 is operable to determine a difference between the first output and the second output, to generate an output difference. In one embodiment, the software compensates for a stored initial offset in determining the output difference. In another embodiment, frequency counters 524 and 526 are operable to store the respective outputs, and external calculations (e.g., a processor of integrated circuit 100 of FIG. 1) are used to determine the output difference. In one embodiment, the external calculations compensate for a stored initial offset in determining the output difference.

With reference to FIG. 5C, measuring circuit 125c is shown. Measuring circuit 125c comprises frequency dividers 530 and 532, multiplexer 534, and frequency counter 536. Measuring circuit 125c operates in a similar manner as measuring circuit 125a of FIG. 5A. However, the first output and second output are divided, if necessary, prior to being received at multiplexer 534.

Frequency counter 536 then receives the outputs. In one embodiment, software of frequency counter 536 is operable to determine a difference between the first output and the second output, to generate an output difference. In one embodiment, the frequency counter 536 compensates for a stored initial offset in determining the output difference. In another embodiment, frequency counter 536 is operable to store both outputs, and external calculations (e.g., a processor of integrated circuit 100 of FIG. 1) are used to determine the output difference. In one embodiment, the external calculations compensate for a stored initial offset in determining the output difference.

With reference to FIG. 2, aging determination circuit 110 is operable to determine the output difference between active circuit 115 and quiet circuit 120. The output difference may be used as an indicator of how much a device (e.g., integrated circuit 100 of FIG. 1) has been exposed to HCI. In one embodiment, the output difference is converted to an estimated aging of the device. This conversion is design dependent, and depends on the particular circuits used as active circuit 115 and quiet circuit 120.

The output difference may be used to optimize the trade-off between device performance and lifetime, by adjusting various parameters of the device. In one embodiment, the output difference is used to increase the supply voltage of an integrated circuit to an optimal point. In another embodiment, the output difference is used to decrease the threshold voltage at which switching frequency increases by a back bias. In another embodiment, the temperature in which the device is located is adjusted to indirectly decrease the threshold voltage. The described embodiments provide an age determination circuit that is operable to improve the performance of a device, while also extending its lifetime, thereby optimizing the trade-off between performance and lifetime.

Figure 6:
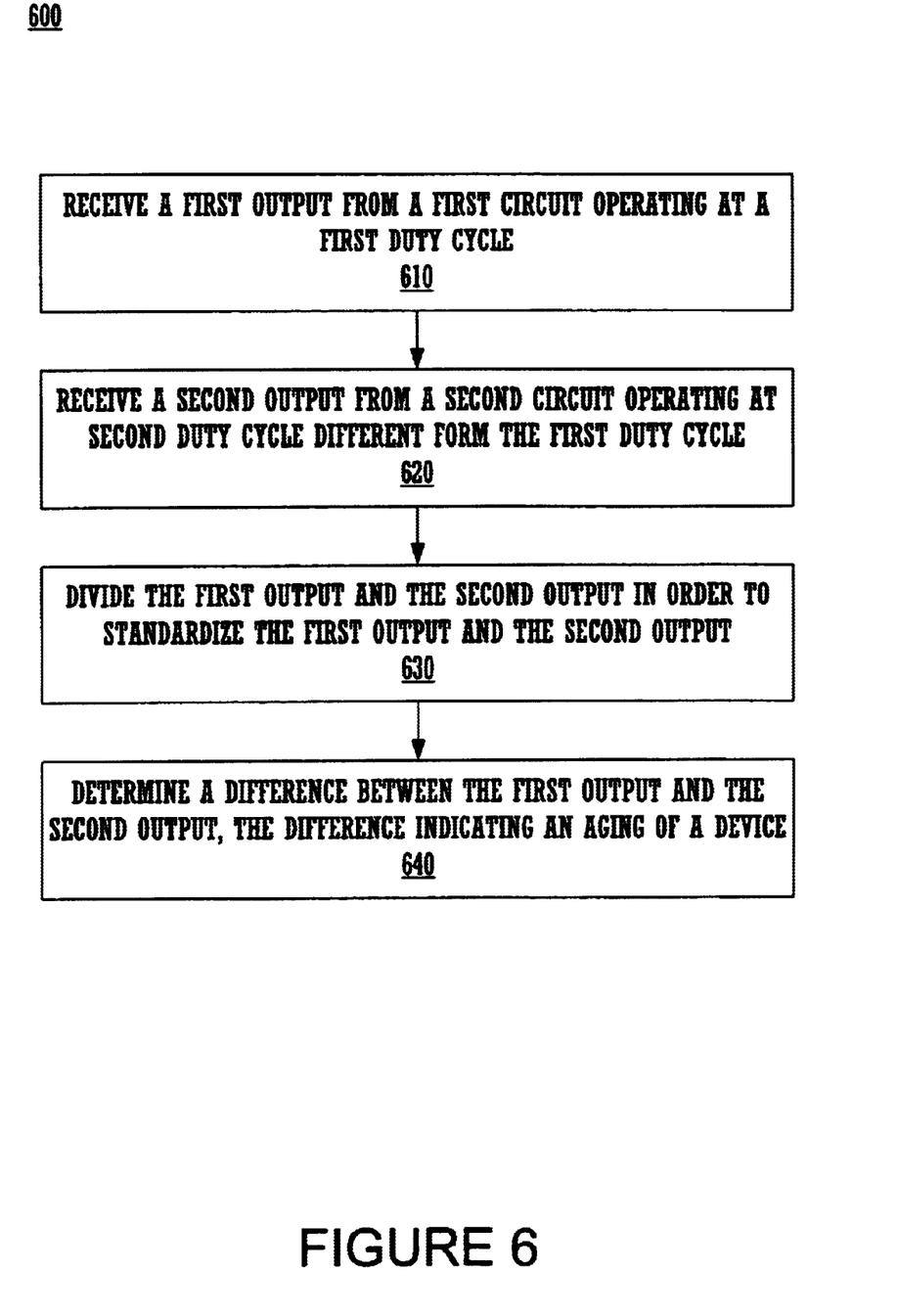
FIG. 6 is a flowchart diagram illustrating steps in an exemplary process for determining an aging of a device in accordance with one embodiment of the present invention.

FIG. 6 is a flowchart diagram illustrating steps in an exemplary process 600 for determining an aging of a device in accordance with one embodiment of the present invention. In one embodiment, process 600 is performed by an aging determination circuit (e.g., aging determination circuit 110 of FIGS. 1 and 2) that is coupled to an electronic device (e.g., integrated circuit 100 of FIG. 1). Although specific steps are disclosed in process 600, such steps are exemplary. That is, the embodiments of the present invention are well suited to performing various other steps or variations of the steps recited in FIG. 6.

At step 610, a first output from an active circuit (e.g., active circuit 115 of FIG. 2) operating at a first duty cycle is received. At step 620, a second output from a quiet circuit (e.g., quiet circuit 120 of FIG. 2) operating at second duty cycle is received, wherein the second duty cycle is different from the first duty cycle. In one embodiment, the first output is measured at a node of the active circuit and the second output is measured at a node of the quiet circuit. In one embodiment, the first output is a first frequency and the second output is a second frequency.

At step 630, the first output and the second output are divided in order to standardize the first output and the second output. In one embodiment, the first output and second output are divided by at least one frequency divider (e.g., frequency divider 512 of FIG. 5A). It should be appreciated that step 630 is optional.

At step 640, a difference between the first output and the second output is determined, wherein the difference indicates an aging of the device. In one embodiment, the difference is determined by compensating for an initial offset of the first output and the second output. As described above, the difference may be used as an indicator of how much a device (e.g., integrated circuit 100 of FIG. 1) has been exposed to HCI. In one embodiment, the difference is converted to an estimated aging of the device. This conversion is design dependent, and depends on the particular circuits used as the active circuit and the quiet circuit. In another embodiment, the difference is used to optimize the trade-off between performance and lifetime of the device.

Various embodiments of the present invention, a device aging determination circuit, are thus described. While the present invention has been described in particular embodiments, it should be appreciated that the present invention should not be construed as limited by such embodiments, but rather construed according to the below claims.

What is claimed is:

1. A device aging determination circuit comprising:
   a first circuit for operating at a first duty cycle and for generating a first output;
   a second circuit for operating at a second duty cycle different from said first duty cycle and for generating a second output; and
   a measuring circuit for determining a difference between said first output and said second output, said difference indicating an aging of said device.

2. The circuit as recited in claim 1 wherein said first circuit and said second circuit are analogous circuits.

3. The circuit as recited in claim 1 wherein said first circuit and said second circuit are ring oscillator circuits.

4. The circuit as recited in claim 3 wherein said ring oscillator circuits are nineteen stage ring oscillator circuits.

5. The circuit as recited in claim 3 wherein said ring oscillator circuits comprise an enable switch.

6. The circuit as recited in claim 1 wherein said first duty cycle is substantially normally on and said second duty cycle is substantially normally off.

7. The circuit as recited in claim 6 wherein said second circuit is powered down.

8. The circuit as recited in claim 6 wherein said second circuit is powered up but not enabled.

9. The circuit as recited in claim 6 wherein said first circuit is powered up in response to a powergood signal.

10. The circuit as recited in claim 6 wherein said first circuit is powered up in response to a resetb signal.

11. The circuit as recited in claim 1 wherein said device is an integrated circuit.

12. The circuit as recited in claim 1 wherein said measuring circuit comprises:
    a multiplexer for selecting between said first output and said second output; and
    a counter circuit for receiving said first output and said second output, and for determining said difference.

13. The circuit as recited in claim 12 wherein said measuring circuit further comprises at least one frequency divider circuit for standardizing said first output and said second output.

14. The circuit as recited in claim 1 wherein said measuring circuit comprises:
    a first counter circuit for receiving said first output; and
    a second counter circuit for receiving said second output.

15. The circuit as recited in claim 14 wherein said measuring circuit further comprises:
    a first frequency divider circuit for standardizing said first output; and
    a second frequency divider circuit for standardizing said second output.

16. The circuit as recited in claim 1 wherein said first output is measured at a node of said first circuit and wherein said second output is measured at a node of said second circuit.

17. The circuit as recited in claim 3 wherein said first output is a first frequency and said second output is a second frequency.

18. The circuit as recited in claim 1 wherein said measuring circuit is operable to compensate for an initial offset in determining said difference.

19. A device aging determination circuit comprising:
    a first oscillator circuit for operating at a first duty cycle and for generating a first frequency, wherein said first duty cycle is substantially normally on;
    a second oscillator circuit for operating at a second duty cycle different from said first duty cycle and for generating a second frequency, wherein said second duty cycle is substantially normally off; and
    a measuring circuit for determining a difference between said first frequency and said second frequency, said difference indicating an aging of said device.

20. The circuit as recited in claim 19 wherein said first oscillator circuit and said second oscillator circuit are analogous oscillator circuits.

21. The circuit as recited in claim 19 wherein said first oscillator circuit and said second oscillator circuit are ring oscillator circuits.

22. The circuit as recited in claim 19 wherein said first oscillator circuit comprises a first enable switch and said second oscillator circuit comprises a second enable switch.

23. The circuit as recited in claim 19 wherein said second oscillator circuit is powered down.

24. The circuit as recited in claim 19 wherein said second oscillator circuit is powered up but not enabled.

25. The circuit as recited in claim 19 wherein said first oscillator circuit is powered up in response to a powergood signal.

26. The circuit as recited in claim 19 wherein said first oscillator circuit is powered up in response to a resetb signal.

27. The circuit as recited in claim 19 wherein said device is an integrated circuit.

28. The circuit as recited in claim 19 wherein said measuring circuit comprises:
    a multiplexer for selecting between said first frequency and said second frequency; and
    a counter circuit for receiving said first frequency and said second frequency, and for determining said difference.

29. The circuit as recited in claim 28 wherein said measuring circuit further comprises at least one frequency divider circuit for standardizing said first frequency and said second frequency.

30. The circuit as recited in claim 19 wherein said measuring circuit comprises:

a first counter circuit for receiving said first frequency; and a second counter circuit for receiving said second frequency.

31. The circuit as recited in claim 30 wherein said measuring circuit further comprises:

a first frequency divider circuit for standardizing said first frequency; and a second frequency divider circuit for standardizing said second frequency.

32. The circuit as recited in claim 19 wherein said first frequency is measured at a node of said first oscillator circuit and wherein said second frequency is measured at a node of said second oscillator circuit.

33. The circuit as recited in claim 19 wherein said measuring circuit is operable to compensate for an initial offset in determining said difference.

34. A method for determining an aging of a device, said method comprising:

receiving a first output from a first circuit operating at a first duty cycle;

receiving a second output from a second circuit operating at second duty cycle different from said first duty cycle; and determining a difference between said first output and said second output, said difference indicating an aging of said device.

35. The method as recited in claim 34 wherein said first circuit and said second circuit are analogous circuits.

36. The method as recited in claim 34 wherein said first circuit and said second circuit are ring oscillator circuits.

37. The method as recited in claim 36 wherein said ring oscillator circuits are nineteen stage ring oscillator circuits.

38. The method as recited in claim 36 wherein said ring oscillator circuits comprise an enable switch.

39. The method as recited in claim 34 wherein said first duty cycle is substantially normally on and said second duty cycle is substantially normally off.

40. The method as recited in claim 39 wherein said second circuit is powered down.

41. The method as recited in claim 39 wherein said second circuit is powered up but not enabled.

42. The method as recited in claim 39 wherein said first circuit is powered up in response to a powergood signal.

43. The method as recited in claim 39 wherein said first circuit is powered up in response to a resetb signal.

44. The method as recited in claim 34 wherein said device is an integrated circuit.

45. The method as recited in claim 34 wherein said determining comprises dividing said first output and said second output in order to standardize said first output and said second output.

46. The method as recited in claim 34 wherein said first output is measured at a node of said first circuit and wherein said second output is measured at a node of said second circuit.

47. The method as recited in claim 34 wherein said first output is a first frequency and said second output is a second frequency.

48. The method as recited in claim 34 wherein said determining comprises by compensating for an initial offset of the first output and the second output.

* * * * *